(12) United States Patent  (10) Patent No.: US 7,816,233 B2
Yeh et al.  (45) Date of Patent: Oct. 19, 2010

(54) METHOD OF MANUFACTURING COMPOSITE WAFER STRUCTURE

(75) Inventors: Jer-Liang Yeh, Taichung (TW); Jing-Yi Huang, Kaohsiung (TW); Wen-Ching Hsu, Sanchong (TW); Ya-Lan Ho, Judung Jen (TW); Sung-Lin Hsu, Hsinchu (TW); Jung-Tsung Wang, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 294 days.

(21) Appl. No.: 11/245,163

(22) Filed: Oct. 7, 2005

(65) Prior Publication Data

US 2007/0020873 A1  Jan. 25, 2007

(30) Foreign Application Priority Data

Jul. 22, 2005 (TW) ............................... 94124815 A

(51) Int. Cl.
*H01L 21/46* (2006.01)
(52) U.S. Cl. ..................... 438/458; 438/113; 438/406; 438/455; 438/459
(58) Field of Classification Search ................. 438/113, 438/406, 455, 458, 459, FOR. 386
See application file for complete search history.

(56) References Cited

U.S. PATENT DOCUMENTS 5,823,325 A 10/1998 Lin
5,959,768 A * 9/1999 Hutton ........................ 359/359
6,140,210 A * 10/2000 Aga et al. ..................... 438/458
6,247,820 B1 * 6/2001 Van Order ................... 359/604
6,541,356 B2 4/2003 Fogel et al.
6,717,217 B2 4/2004 Fogel et al.
6,750,476 B2 * 6/2004 Katayama ..................... 257/59
2002/0004302 A1 * 1/2002 Fukumoto .................... 438/689
2002/0034604 A1 * 3/2002 Arioka et al. ................ 428/64.4
2003/0153162 A1 * 8/2003 Nakano et al. ............... 438/458
2004/0184394 A1 * 9/2004 Gotoh et al. ................. 369/275.3
2005/0064632 A1 * 3/2005 Sakurada et al. ............. 438/149
2005/0074954 A1 * 4/2005 Yamanaka ................... 438/458
2005/0148121 A1 * 7/2005 Yamazaki et al. ............ 438/149
2005/0266657 A1 * 12/2005 Moriwaki .................... 438/455
2006/0154445 A1 * 7/2006 Iwabuchi .................... 438/458
2006/0264035 A1 * 11/2006 Nogami ...................... 438/638
2007/0042578 A1 * 2/2007 Sasaki et al. ................ 438/515

* cited by examiner

*Primary Examiner*—N Drew Richards
*Assistant Examiner*—Joannie A Garcia

(57) ABSTRACT

The invention provides a method of manufacturing a composite wafer structure. In particular, the method, according to the invention, is based on the fracture mechanics theory to actively control fracture induced during the manufacture of the composite wafer structure and to further protect from undesired edge damage. Thereby, the method, according to the invention, can enhance the yield rate of industrial mass production regarding the composite wafer structure.

28 Claims, 10 Drawing Sheets

METHOD OF MANUFACTURING COMPOSITE WAFER STRUCTURE

BACKGROUND OF THE INVENTION

1. Field of the Invention

The invention relates to a method of manufacturing a composite wafer structure, and more particularly, to a method of manufacturing a composite wafer structure which actively controls fracture induced during the manufacture of the composite wafer structure and further protects the composite wafer from undesired edge damage.

2. Description of the Prior Art

Composite wafer structure, such as a Silicon-on-insulator (SOI) structure, has been applied extensively to be the substrate of a semiconductor process or a microelectromechanical process. Below is an example of a typical SOI structure to illustrate the edge damage which often occurs during the manufacture of a composite wafer structure.

Please refer to FIG. 1; FIG. 1 is a sectional view of a typical SOI structure 1. The SOI structure 1 basically includes a device wafer 12 and a base wafer 14.

As shown in FIG. 1, the device wafer 12 has a bond surface 122 and a bottom surface 124. According to the process of manufacturing the SOI structure 1, the device wafer 12 is bonded to the top surface 142 of the base wafer 14 with its own bond surface 122. In particular, a silicon oxide layer 16 is formed on the bond surface 122 of the device wafer 12 and/or the top surface 142 of the base wafer 14 before the bonding process. FIG. 1 is an example of the oxidized layer 16 only formed on the top surface 142 of the base wafer 14. In addition, an annealing treatment can be performed to the bonded device wafer 12 and the base wafer 14 to enhance the bonding strength between the device wafer 12 and the base wafer 14. Generally, a chemical mechanical polishing (CMP) process will be performed on the bottom surface 124 of the device wafer 12 until the initial thickness of the device wafer 12 is reduced to an expected thickness.

However, because of the limitation on the alignment of the processing machines itself, after the bonding of the device wafer 12 and the base wafer 14, the top surface 142 of the base wafer 14 and the bond surface 122 of the device wafer 12 cannot tightly bond together at the edges thereof, and a gap remains between the edges thereof. During the subsequent grinding process to the bottom surface 124 of the device wafer 12 to reduce the thickness of the device wafer 12, the edge of the device wafer 12 described above cannot bear the load from the grinding machines, and further unexpected fracture will occur, which is called edge damage (as No. 126 shown in FIG. 1). The edge damage of the SOI structure described above will lower the available area of the SOI structure and will waste material of the wafer in the consequent process of manufacturing semiconductor integrated circuit; it will even reduce the yield rate of the mass production regarding the SOI structure. Notice that the problem of edge damage described above also happens easily in other types of composite wafer structures.

A lot of literature with regard to reducing the probability of edge damage of SOI structure during the manufacturing process have been disclosed and are listed as follows: U.S. Pat. Nos. 5,823,325; 6,541,356 and 6,717,217.

Through understanding of prior arts, they obviously are all based on the view of passive fracture control to prevent the occurrence of fracture. However, mass production regarding the composite wafer structure by applying the prior arts cannot prevent the edge damage. Furthermore, the complexity of the manufacturing process is also increased in some prior arts.

Comparing with the prior art, the manufacture of the composite wafer structure enclosed in the present invention is based on the view of active fracture control. It is to say, fracture (different from the fracture which can cause edge damage) will certainly happen and should be controlled, so as to enhance the process of manufacturing composite wafer structure.

SUMMARY OF THE INVENTION

Accordingly, the scope of the invention is to provide a method for manufacturing a composite wafer structure. In particular, the method, according to the invention, is based on fracture mechanics theory to actively control fracture induced during the manufacture of the composite wafer structure, and to further prevent undesired edge damage. Thereby, the method according to the invention can enhance the yield rate of the industrial mass production regarding the composite wafer structure.

According to the first preferred embodiment of the invention, the method of manufacturing a composite wafer structure is first to prepare a device wafer. The device wafer has a first circumference, a bond surface, and a bottom surface. Consequently, a groove is formed on the bond surface along the first circumference of the device wafer, and a margin exists between the groove and the first circumference of the device wafer. Afterward, a base wafer is prepared. The base wafer has a top surface. Then, the bond surface of the device wafer is bonded onto the top surface of the base wafer. Finally, the grinding and polishing process of the bottom surface of the device wafer is performed until an initial thickness of the device wafer is reduced into an expected thickness to complete the composite wafer structure. In particular, during the grinding and polishing of the bottom surface of the device wafer, the margin is fractured by cracks induced at a tip of the groove and then removed.

According to the second preferred embodiment of the invention, the method of manufacturing a composite wafer structure is first to prepare a device wafer. The device wafer has a first circumference, a bond surface, and a bottom surface. Consequently, a hydrogen ion implantation process is performed for the bond surface of the device wafer at a region along the first circumference and with a margin apart from the first circumference, such that at the region, hydrogen ions are implanted in the device wafer from near the bond surface to a predetermined depth underneath the bond surface. Afterward, a base wafer is prepared. The base wafer has a top surface. Consequently, the bond surface of the device wafer is bonded onto the top surface of the base wafer. Then, an annealing treatment is performed to the bonded device wafer and base wafer to aggregate the implanted hydrogen ions into micro voids distributed in the device wafer from near the bond surface to the predetermined depth underneath the bond surface. Finally, a grinding and polishing process of the bottom surface of the device wafer is performed until an initial thickness of the device wafer is reduced to an expected thickness to complete the composite wafer structure. In particular, during the grinding and polishing of the bottom surface of the device wafer, the margin is fractured by the micro voids and then removed.

The advantage and spirit of the invention may be understood by the following recitations together with the appended drawings.

BRIEF DESCRIPTION OF THE APPENDED DRAWINGS

DETAILED DESCRIPTION OF THE INVENTION

The invention is to provide a method of manufacturing a composite wafer structure; particularly, the invention relates to a method of manufacturing a composite wafer structure which actively controls fracture induced during the manufacture of the composite wafer structure and further protects the composite wafer from undesired edge damage.

Please refer to FIG. 2A through FIG. 2H, FIG. 2A through FIG. 2H are sectional views for describing the method of manufacturing a composite wafer structure according to the first preferred embodiment of the invention.

Figure 1:
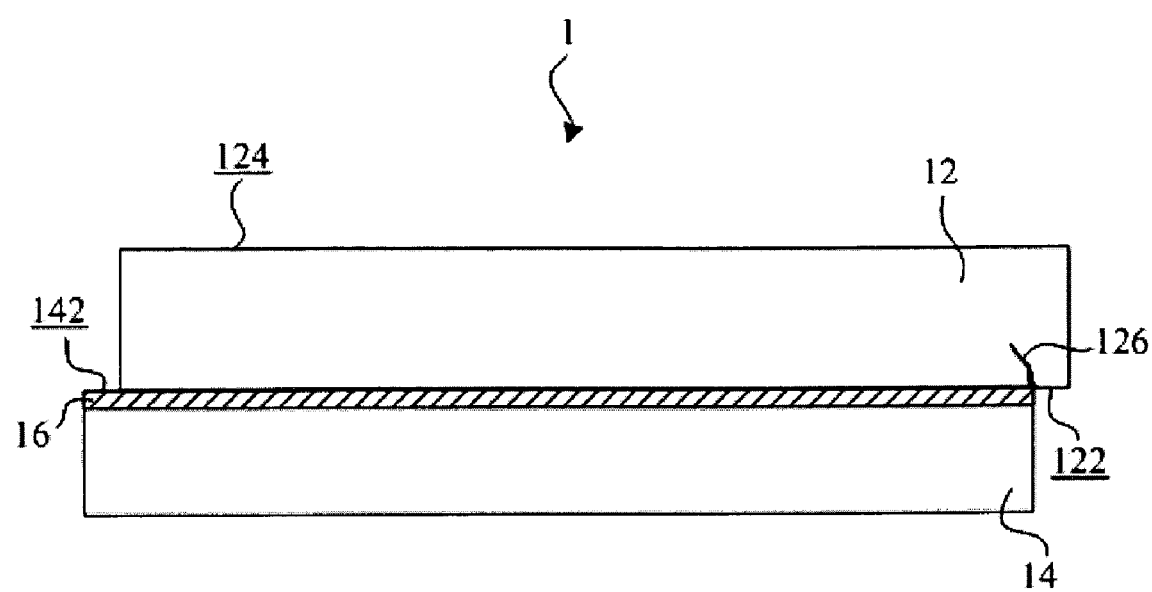
FIG. 1 is a sectional view of a typical SOI structure.
Figure 2A:
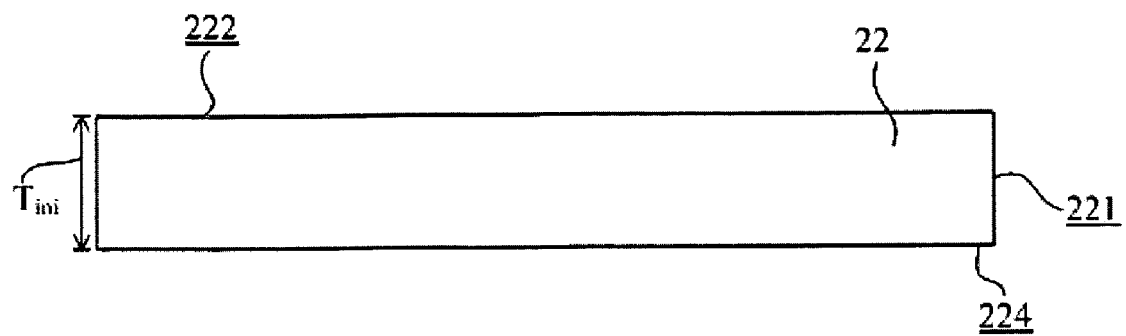
FIG. 2A through FIG. 2H are sectional views for describing the method of manufacturing a composite wafer structure according to the first preferred embodiment of the invention.

First of all, as shown in FIG. 2A, a device wafer 22 is prepared. The device wafer 22 has a first circumference 221, a bond surface 222, and a bottom surface 224.

Figure 2B:
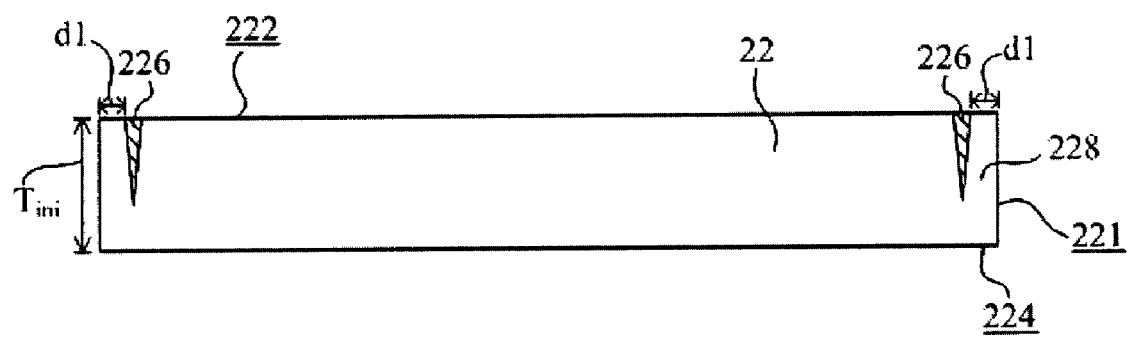

Consequently, a groove 226 is formed on the bond surface 222 along the first circumference 221 of the device wafer 22, as shown in FIG. 2B. Notice that a margin 228 exists between the groove 226 and the first circumference 221 of the device wafer 22. The thickness of the margin 228 is d1.

In practice, sections of the groove can be a V form or other forms which can enhance the stress concentration factor of the tip.

In an embodiment, the groove 226 can be formed by a mechanical process, a laser cutting process, an etching process or a water-jet cutting process.

Figure 2C:
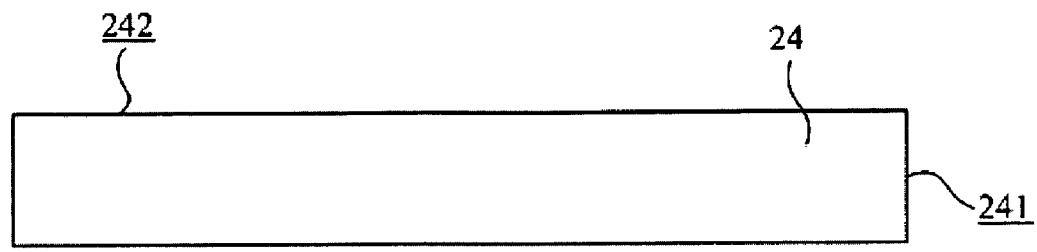

Consequently, a base wafer 24 is prepared, as shown in FIG. 2C. The base wafer 24 has a second circumference 241 and a top surface 242.

Figure 2D:
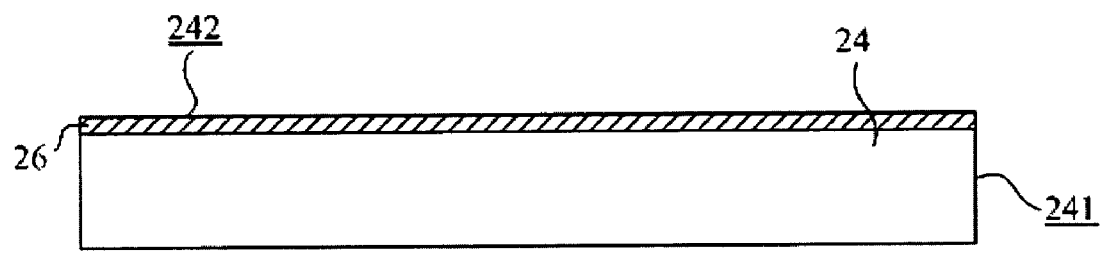

In addition, according to practical requirement, an oxidized layer can be formed on the bond surface 222 of the device wafer 22 and/or on the top surface 242 of the base wafer 24. As shown in FIG. 2D, FIG. 2D is an example of the oxidized layer 26 only formed on the top surface 242 of the base wafer 24.

Figure 2E:
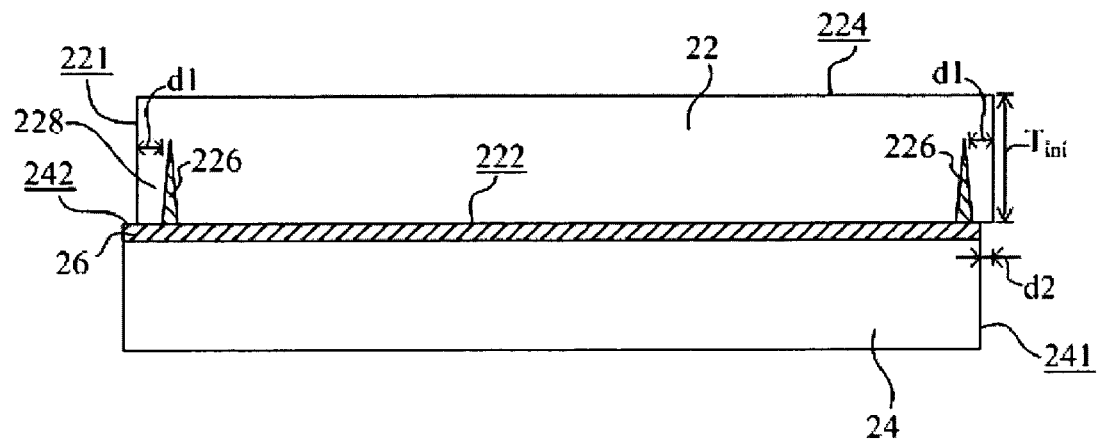

Afterward, the bond surface 222 of the device wafer 22 is bonded onto the top surface 242 of the base wafer 24, as shown in FIG. 2E. In addition, an annealing treatment can be performed to the bonded device wafer 22 and the base wafer 24 to enhance the bonding strength between the device wafer 22 and the base wafer 24. Before the bond surface 222 of the device wafer 22 is bonded onto the top surface 242 of the base wafer 24, a plasma treatment is applied on the bond surface 222 of the device wafer 22 and the top surface 242 of the base wafer 24. Thereby, the bonding strength between the device wafer 22 and the base wafer 24 can be enhanced, and the temperature of the consequent annealing treatment will not be too high.

Notice that because of the limitation on the alignment of the processing machines itself, after the bonding of the device wafer and the base wafer, an area which is not bonded between the bond surface 222 of the device wafer 22 and the top surface 242 of the base wafer 24 will exist. As shown in FIG. 2E, the maximum radial distance on the bond surface 222 of the device 22 not bonded with the top surface 242 of the base wafer 24 is defined as a mismatch gap d2. In practical application, the thickness of the margin 228 d1 is equal to or larger than the mismatch gap d2. This is to say, the design of the thickness of the margin is based on the maximum value of the mismatch gap possibly caused by the processing machines under related process condition. The thickness of the margin has to be equal to or larger than the mismatch gap to ensure that the whole groove will locate on the base wafer, after the bonding of the device wafer and the base wafer.

Figure 2F:
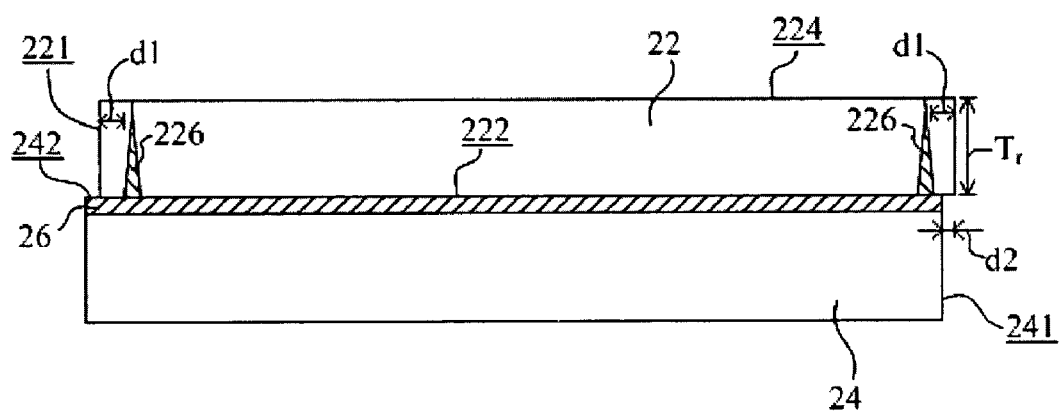
Figure 2G:
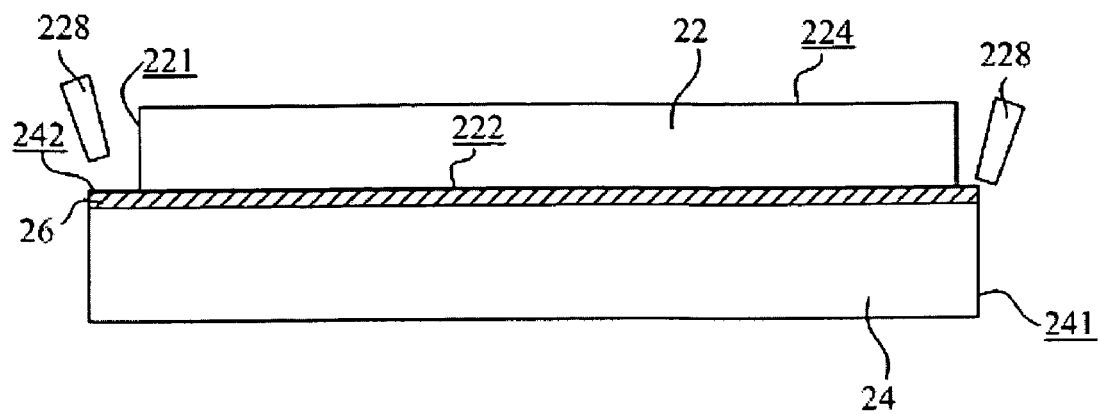
Figure 2H:
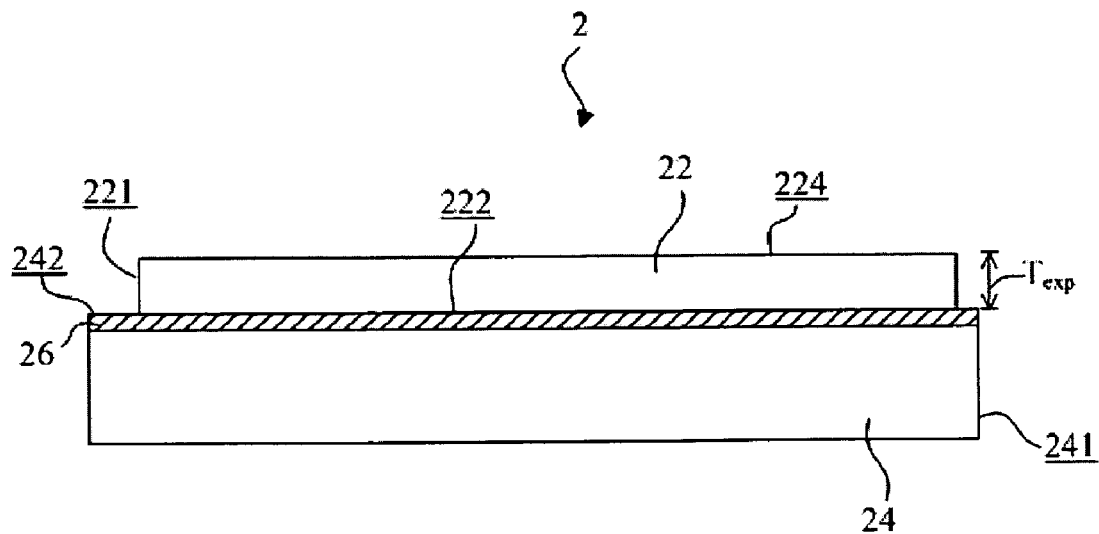

Afterward, the grinding and polishing process, such as a CMP process, of the bottom surface of the device wafer is performed until an initial thickness of the device wafer is reduced to an expected thickness to complete the composite wafer structure, as shown in FIG. 2H.

In particular, as shown in FIG. 2F, during the grinding and polishing of the bottom surface 224 of the device wafer 22, because the tip of the groove 226 has stress concentration factor, cracks will occur at the tip of the groove 226. The cracks will grow and deliver broadly along the direction perpendicular to the bottom surface 224 and will further cause fracture on the margin 228. At this time, the residual thickness $T_r$ of the device wafer 22 is between the initial thickness $T_{ini}$ and the expected thickness $T_{exp}$. As shown in FIG. 2G, during the grinding of the bottom surface 224 of the device wafer 22, before the thickness of the device wafer 22 is reduced to the expected thickness $T_{exp}$, the fractured margin 228 will depart from the device wafer 22 and then will be removed.

Additionally, according to the method of the first preferred embodiment of the present invention, the second circumference 241 of the base wafer 24 can be further grinded or laser cut until the diameter of the base wafer 24 is reduced to be equal to that of the device wafer 22.

In an embodiment, the device wafer 22 and the base wafer 24 are both formed of a semiconductor material to form the homo-bonding structure. For example, while applying the manufacturing method of the first preferred embodiment in the invention to form a SOI structure, the device wafer and the base wafer are both formed of a silicon material.

In another embodiment, the device wafer 22 is formed of a first semiconductor material, and the base wafer 24 is formed of a second semiconductor material different from the first semiconductor material to form the hetero-bonding structure. For example, the second semiconductor material is a silicon material, and the first semiconductor material is one selected from the group consisting of a SiGe material, a LiNbO$_3$ material, a sapphire material, and an oxide material.

Please refer to FIG. 3A through FIG. 3I; these figures are sectional views for describing the method of manufacturing a composite wafer structure according to the first preferred embodiment of the invention.

Figure 3A:
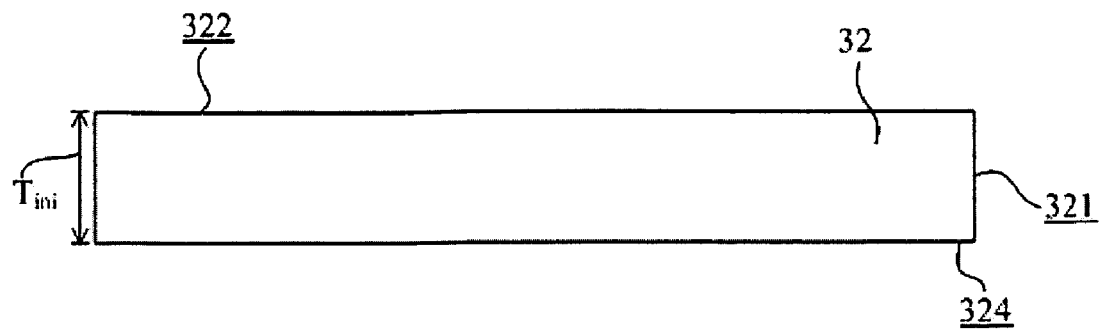
FIG. 3A through FIG. 3I are sectional views for describing the method of manufacturing a composite wafer structure according to the second preferred embodiment of the invention.

First of all, as shown in FIG. 3A, a device wafer 32 is prepared. The device wafer 32 has a first circumference 321, a bond surface 322, and a bottom surface 324.

Figure 3B:
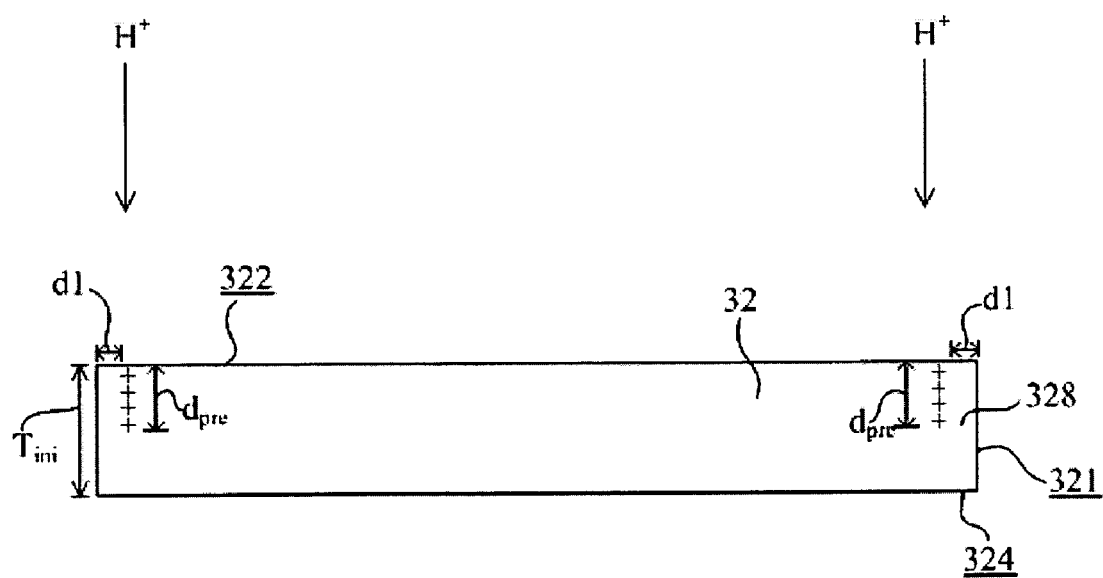

Consequently, as shown in FIG. 3B, a hydrogen ion implantation process is performed for the bond surface 322 of the device wafer 32 at a region along the first circumference 321 and with a margin 328 apart from the first circumference 321, such that at the region, hydrogen ions are implanted in the device wafer 32 from near the bond surface 322 to a predetermined depth $d_{pre}$ underneath the bond surface 322. The thickness of the margin 328 is d1.

Figure 3C:
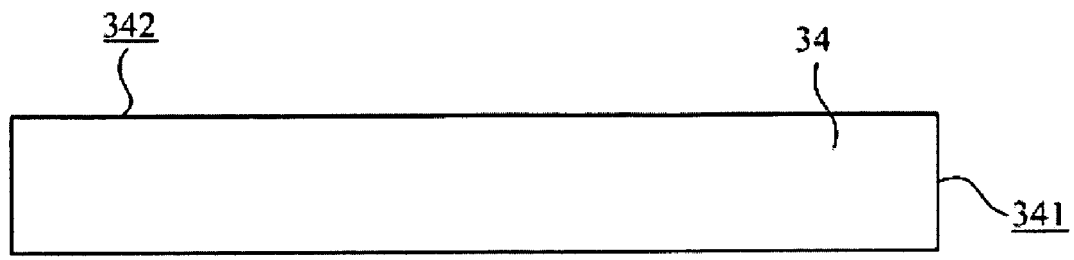

Afterward, as shown in FIG. 3C, a base wafer 34 is prepared. The base wafer 34 has a second circumference 341 and a top surface 342.

Figure 3D:
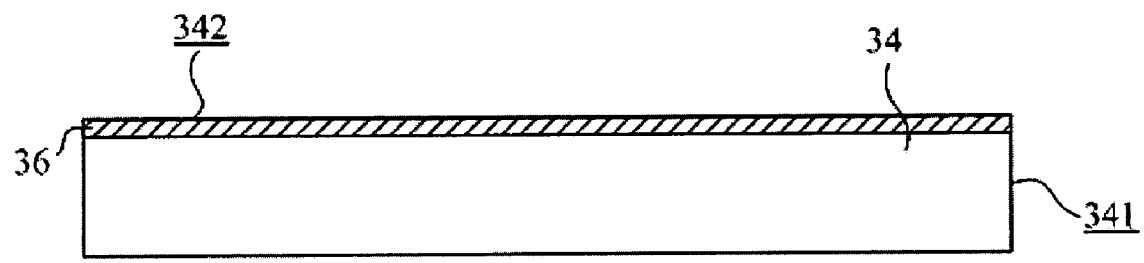

In addition, according to practical requirement, an oxidized layer can be formed on the bond surface 322 of the device wafer 32 and/or on the top surface 342 of the base wafer 34. As shown in FIG. 3D, FIG. 3D is an example of the oxidized layer 36 only formed on the top surface 342 of the base wafer 34.

Figure 3E:
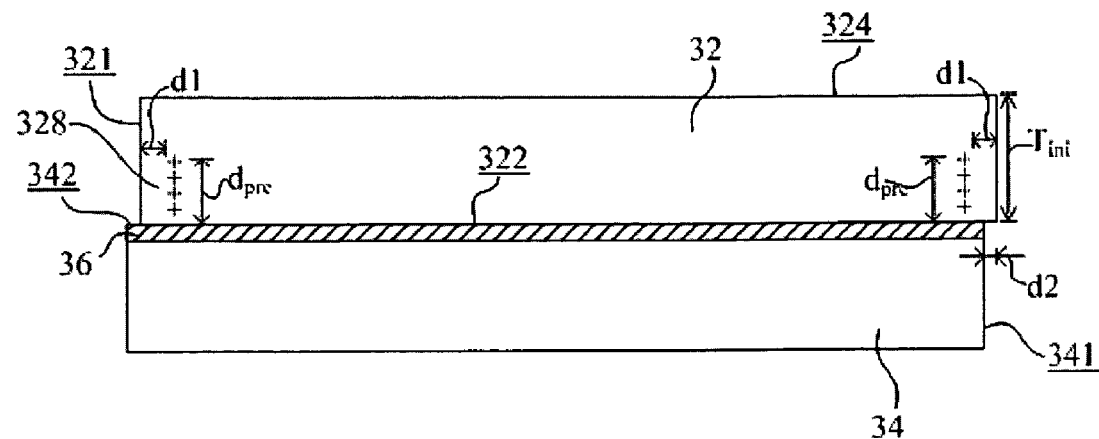

Afterward, the bond surface 322 of the device wafer 32 is bonded onto the top surface 342 of the base wafer 34, as shown in FIG. 3E.

Notice that because of the limitation on the alignment of the processing machines itself, after the bonding of the device wafer and the base wafer, an area not bonded between the bond surface 322 of the device wafer 32 and the top surface 342 of the base wafer 34 will exist. As shown in FIG. 2E, the maximum radial distance on the bond surface 322 of the device 32 not bonded with top surface 342 of the base wafer 34 is defined as a mismatch gap d2. In practical application, the thickness of the margin 328 d1 is equal to or larger than the mismatch gap d2. This is to say, the design of the thickness of the margin is based on the maximum value of the mismatch gap possibly caused by the processing machines under related processing conditions. The thickness of the margin has to be equal to or larger than the mismatch gap to ensure that the region with implanted hydrogen ions of the device wafer will be located on the base wafer, after the bonding of the device wafer and the base wafer.

Figure 3F:
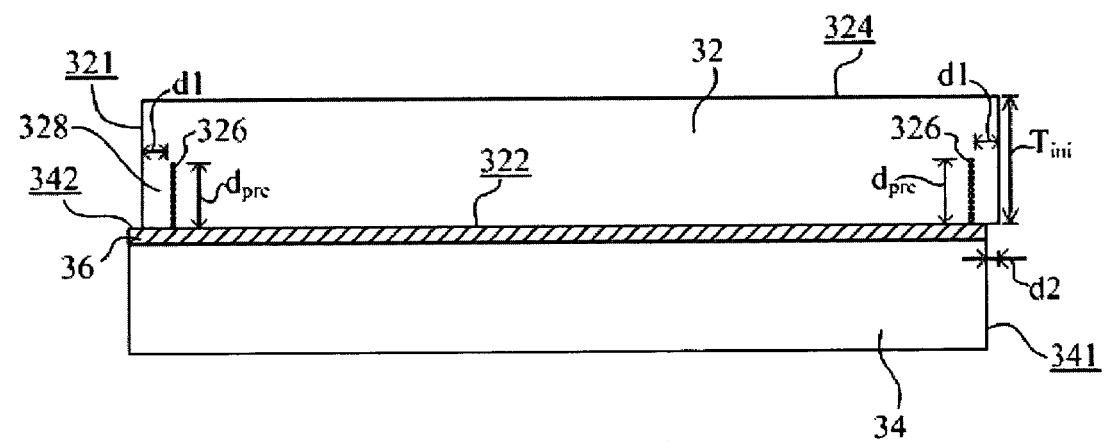

Afterward, as shown in FIG. 3F, an annealing treatment is performed to the bonded device wafer 32 and base wafer 34 to aggregate the implanted hydrogen ions into micro voids 326 distributed in the device wafer 32 from near the bond surface 322 to the predetermined depth $d_{pre}$ underneath the bond surface 322. At this time, the bonding strength between the device wafer 32 and the base wafer 34 can be enhanced by controlling the temperature. Before the bond surface 322 of the device wafer 32 is bonded onto the top surface 342 of the base wafer 34, a plasma treatment is applied on the bond surface 322 of the device wafer 32 and the top surface 342 of the base wafer 34. Thereby, the bonding strength between the device wafer 32 and the base wafer 34 can be enhanced, and the temperature of the consequent annealing treatment will not be too high.

Figure 3G:
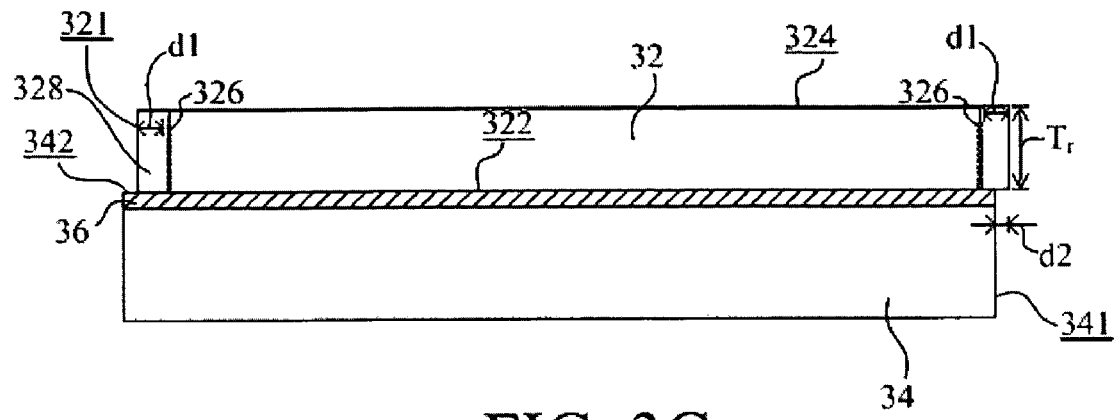
Figure 3H:
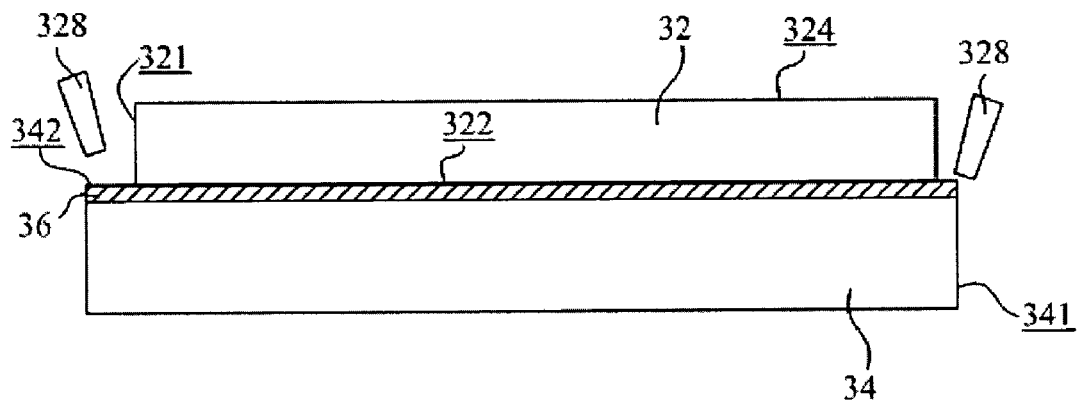
Figure 3I:
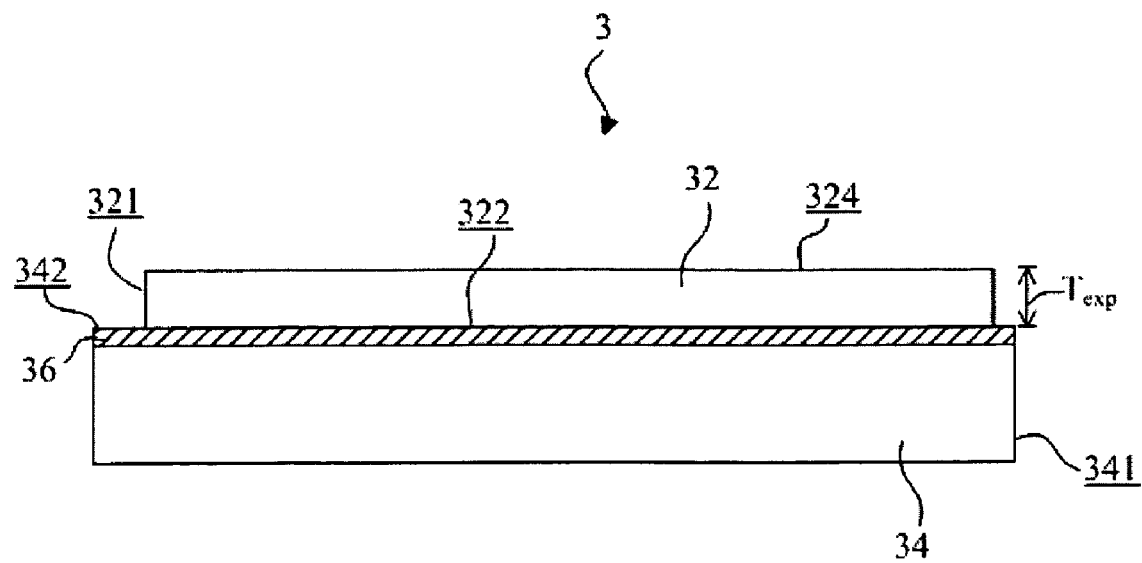

Consequently, as shown in FIG. 3I, the grinding and polishing process, such as a CMP process, of the bottom surface 324 of the device wafer 32 is performed until an initial thickness $T_{ini}$ of the device wafer 32 is reduced to an expected thickness $T_{exp}$ to complete the composite wafer structure 3.

In particular, as shown in FIG. 3G, during the grinding and polishing of the bottom surface 324 of the device wafer 32, because the micro voids 326 cannot bear the load from grinding machines, cracks will occur around the micro voids 326. Based on the distribution of the micro voids, the cracks will grow and deliver broadly along the direction perpendicular to the bottom surface 324 and will cause fracture on the margin 328. At this time, the residual thickness $T_r$ of the device wafer 32 is between the initial thickness $T_{ini}$ and the expected thickness $T_{exp}$. As shown in FIG. 3H, during the grinding of the bottom surface 324 of the device wafer 32, before the thickness of the device wafer 32 is reduced to the expected thickness $T_{exp}$, the fractured margin 328 will depart from the device wafer 32 and then will be removed.

Additionally, according to the method of the second preferred embodiment of the present invention, the second circumference 341 of the base wafer 34 can be further grinded or laser cut until the diameter of the base wafer 34 is reduced to be equal to that of the device wafer 32.

In an embodiment, the device wafer 32 and the base wafer 34 are both formed of a semiconductor material to form the homo-bonding structure. For example, while applying the manufacturing method of the first preferred embodiment in the invention to form a SOI structure, the device wafer and the base wafer are both formed of a silicon material.

In another embodiment, the device wafer 32 is formed of a first semiconductor material, and the base wafer 34 is formed of a second semiconductor material different from the first semiconductor material to form the hetero-bonding structure. For example, the second semiconductor material is a silicon material, and the first semiconductor material is one selected from the group consisting of a SiGe material, a $LiNbO_3$ material, a sapphire material, and an oxide material.

Obviously, comparing with the manufacture of the composite wafer structure of the prior art, the manufacture of the composite wafer structure according to the present invention is to actively and effectively control fracture and to further prevent undesired edge damage. Thereby, the manufacture of the composite wafer structure according to the invention is helpful to enhance the yield rate of the industrial mass production regarding the composite wafer structure.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of manufacturing a composite wafer structure, comprising the steps of:
    (a) preparing a device wafer having a first circumference, a bond surface and a bottom surface;
    (b) forming a groove on the bond surface along the first circumference of the device wafer, wherein a margin exists between the groove and the first circumference of the device wafer;
    (c) preparing a base wafer having a top surface;
    (d) bonding the bond surface of the device wafer onto the top surface of the base wafer; and
    (e) grinding and polishing the bottom surface of the device wafer until an initial thickness of the device wafer is reduced into an expected thickness to complete the composite wafer structure;
    wherein during the grinding and polishing of the bottom surface of the device wafer, the margin is fractured by cracks induced at a tip of the groove and then removed;
    wherein the base wafer has a second circumference, after step (d), in which a maximum radial distance on the bond surface of the device not bonded with the top surface of the base wafer is defined as a mismatch gap, and a thickness of the margin is equal to or larger than the mismatch gap;
    wherein the second circumference of the base wafer is ground or laser cut until a diameter of the base wafer is reduced to be equal to that of the device wafer; and
    wherein the device wafer and the base wafer are respectively formed of a semiconductor material of a first type and a second type.

2. The method of claim 1, between step (d) and step (e), further comprising the step of:
    performing an annealing treatment to enhance a bonding strength between the device wafer and the base wafer.

3. The method of claim 2, wherein in step (d), before the bond surface of the device wafer is bonded onto the top surface of the base wafer, a plasma treatment is applied on the bond surface of the device wafer and the top surface of the base wafer.

4. The method of claim 1, wherein the groove is formed by a mechanical process, a laser cutting process, an etching process, or a water-jet cutting process.

5. The method of claim 1, between step (c) and step (d), further comprising the step of:
   performing an oxidized layer on the bond surface of the device wafer and/or on the top surface of the base wafer.

6. The method of claim 5, wherein the first type semiconductor material is a silicon material.

7. The method of claim 1, wherein the second type semiconductor material is different from the first type semiconductor material.

8. The method of claim 7, wherein the second type semiconductor material is a silicon material, and the first type semiconductor material is one selected from the group consisting of a SiGe material, a LiNbO$_3$ material, a sapphire material, and an oxide material.

9. A method of manufacturing a composite wafer structure, comprising the steps of:
   (a) preparing a device wafer having a first circumference, a bond surface, and a bottom surface;
   (b) performing a hydrogen ion implantation process for the bond surface of the device wafer at a region along the first circumference and with a margin apart from the first circumference, such that at the region, hydrogen ions are implanted in the device wafer from near the bond surface to a predetermined depth underneath the bond surface;
   (c) preparing a base wafer having a top surface;
   (d) bonding the bond surface of the device wafer onto the top surface of the base wafer;
   (e) performing an annealing treatment to aggregate the implanted hydrogen ions into micro voids distributed in the device wafer from near the bond surface to the predetermined depth underneath the bond surface; and
   (f) grinding and polishing the bottom surface of the device wafer until an initial thickness of the device wafer is reduced into an expected thickness to complete the composite wafer structure;
   wherein during the grinding and polishing of the bottom surface of the device wafer, the margin is fractured by the micro voids and then removed;
   wherein the base wafer has a second circumference, after the step of bonding the bonding surface of the device wafer onto the top surface of the base wafer, a maximum radial distance on the bond surface of the device not bonded with the top surface of the base wafer is defined as a mismatch gap, and a thickness of the margin is equal to or larger than the mismatch gap; and
   wherein the second circumference of the base wafer is ground or laser cut until a diameter of the base wafer is reduced to be equal to that of the device wafer; and
   wherein the device wafer and the base wafer are formed of a semiconductor material of a first type and a second type.

10. The method of claim 9, wherein in step (d), before the bond surface of the device wafer is bonded onto the top surface of the base wafer, a plasma treatment is applied on the bond surface of the device wafer and the top surface of the base wafer.

11. The method of claim 9, between step (c) and step (d), further comprising the step of:
   forming an oxidized layer on the bond surface of the device wafer and/or on the top surface of the base wafer.

12. The method of claim 11, wherein the first type semiconductor material is a silicon material.

13. The method of claim 9, wherein the second type semiconductor material is different from the first type semiconductor material.

14. The method of claim 13, wherein the second type semiconductor material is a silicon material, and the first type semiconductor material is one selected from the group consisting of a SiGe material, a LiNbO$_3$ material, a sapphire material, and an oxide material.

15. A method of manufacturing a composite wafer structure, comprising the steps of:
   (a) preparing a device wafer having a first circumference, a bond surface and a bottom surface;
   (b) forming a groove on the bond surface along the first circumference of the device wafer, wherein a margin exists between the groove and the first circumference of the device wafer;
   (c) preparing a base wafer having a top surface;
   (d) bonding the bond surface of the device wafer onto the top surface of the base wafer; and
   (e) grinding and polishing the bottom surface of the device wafer until an initial thickness of the device wafer is reduced into a thickness to complete the composite wafer structure;
   wherein during the grinding and polishing of the bottom surface of the device wafer, the margin is fractured by cracks induced at a tip of the groove and then removed; and
   wherein the device wafer is formed of a first semiconductor material, and the base wafer is formed of a second semiconductor material different from the first semiconductor material.

16. The method of claim 15, wherein the base wafer has a second circumference, after step (d), in which a maximum radial distance on the bond surface of the device wafer not bonded with the top surface of the base wafer is defined as a mismatch gap, and a thickness of the margin is equal to or larger than the mismatch gap.

17. The method of claim 16, further comprising the step of:
   grinding or laser cutting the second circumference of the base wafer until a diameter of the base wafer is reduced to be equal to that of the device wafer.

18. The method of claim 15, between step (d) and step (e), further comprising the step of:
   performing an annealing treatment to enhance a bonding strength between the device wafer and the base wafer.

19. The method claim 18, wherein in step (d), before the bond surface of the device wafer is bonded onto the top surface of the base wafer, a plasma treatment is applied on the bond surface of the device wafer and the top surface of the base wafer.

20. The method of claim 15, wherein the groove is formed by a mechanical process, a laser cutting process, an etching process, or a water-jet cutting process.

21. The method of claim 15, between step (c) and step (d), further comprising the step of:
   forming an oxidized layer on the bond surface of the device wafer and/or on the top surface of the base wafer.

22. The method of claim 21, wherein the first semiconductor material is a silicon material.

23. The method of claim 15, wherein the second semiconductor material is a silicon material, and the first semiconductor material is one selected from the group consisting of a SiGe material, a LiNbO$_3$ material, a sapphire material, and an oxide material.

24. A method of manufacturing a composite wafer structure, comprising the steps of:

(a) preparing a device wafer having a first circumference, a bond surface and a bottom surface;
(b) forming a hydrogen ion implantation process for the bond surface of the device wafer at a region along the first circumference and with a margin apart from the first circumference, such that at the region, hydrogen ions are implanted in the device wafer from near the bond surface to a depth underneath the bond surface;
(c) preparing a base wafer having a top surface;
(d) bonding the bond surface of the device wafer onto the top surface of the base wafer;
(e) performing an annealing treatment to aggregate the implanted hydrogen ions into micro voids distributed in the device wafer from near the bond surface to the depth underneath the bond surface; and
(f) grinding and polishing the bottom surface of the device wafer until an initial thickness of the device wafer is reduced into a thickness to complete the composite wafer structure;
wherein during the grinding and polishing of the bottom surface of the device wafer, the margin is fractured by cracks induced at a tip of the groove and then removed; and
wherein the device wafer is formed of a first semiconductor material, and the base wafer is formed of a second semiconductor material different from the first semiconductor material; and wherein the second semiconductor material is a silicon material, and the first semiconductor material is one selected from the group consisting of a SiGe material, a LiNbO$_3$ material, a sapphire material, and an oxide material.

25. The method of claim 24, wherein the base wafer has a second circumference, after the step of bonding the bond surface of the device wafer onto the top surface of the base wafer, in which a maximum radial distance on the bond surface of the device wafer not bonded with the top surface of the base wafer is defined as a mismatch gap, and a thickness of the margin is equal to or larger than the mismatch gap.

26. The method of claim 25, further comprising the step of:
grinding or laser cutting the second circumference of the base wafer until a diameter of the base wafer is reduced to be equal to that of the device wafer.

27. The method claim 24, wherein in step (d), before the bond surface of the device wafer is bonded onto the top surface of the base wafer, a plasma treatment is applied on the bond surface of the device wafer and the top surface of the base wafer.

28. The method of claim 24, between step (c) and step (d), further comprising the step of:
forming an oxidized layer on the bond surface of the device wafer and/or on the top surface of the base wafer.

* * * * *